(12) United States Patent
Graef et al.

(10) Patent No.: US 6,502,230 B1
(45) Date of Patent: Dec. 31, 2002

(54) CIRCUIT MODELING

(75) Inventors: Stefan Graef, Milpitas, CA (US); Sheela Shreedharan, Milpitas, CA (US)

(73) Assignee: LSI Logic Corporation, Milpitas, CA (US)

( * ) Notice: Subject to any disclaimer, the term of this patent is extended or adjusted under 35 U.S.C. 154(b) by 90 days.

(21) Appl. No.: 09/847,460

(22) Filed: May 2, 2001

(51) Int. Cl.[7] .............................................. G06F 17/50
(52) U.S. Cl. ........................................ 716/14; 716/12
(58) Field of Search ........................................ 716/1–7

(56) References Cited

U.S. PATENT DOCUMENTS 6,066,177 A * 5/2000 Hatsuda ...................... 703/14

OTHER PUBLICATIONS

Compact distributed RLC interconnect model. Davis et al. Electron Devices, IEEE Transactions on pp: 2068–2077.*

* cited by examiner

*Primary Examiner*—Cuong Quang Nguyen
(74) *Attorney, Agent, or Firm*—Suiter & Associates PC

(57) ABSTRACT

The present invention is directed to a system and method of modeling electrical circuits. The present invention may provide improved software for predicting microchip interconnect delays, and in general for an improved semiconductor manufacturing models. Further, the invention may provide for accurate prediction of resistance, capacitance and inductance for interconnections in a semiconductor, allowing for both environmental values and process variations.

25 Claims, 3 Drawing Sheets

CIRCUIT MODELING

FIELD OF THE INVENTION

The present invention generally relates to the field of electrical circuits, and particularly to software suitable for modeling manufacturing processes for the fabrication of semiconductor circuits.

BACKGROUND OF THE INVENTION

Modern digital design of complex circuits and systems, which can contain millions of interconnected gates, involves a number of techniques for managing a design. Tools using computer-aided design (CAD), hardware description languages (HDL), logic synthesis, hierarchy design, and "divide and conquer" strategies such as top-down design are employed.

A hardware description language (HDL) representation of a circuit, such as a Verilog description, is a representation of a circuit in text rather than graphically, enabling a more uniform, portable representation of the circuit, one that can be manipulated by a computer program. HDL may be stylized into "structural" (e.g. at the gate-level), "behavioral" or "dataflow" (typically at the higher level description of a circuit), or any combination of the above. HDL representations are used in logic synthesis, the conversion of a high-level electronic circuit description into a list of logic gates and their interconnections, called the "netlist".

An HDL description of a system can be written at an intermediate level referred to as a register transfer language (RTL). A subset of RTL that is used by logic synthesis tools (such as Synopsys' DesignCompiler and Cadence's Buildgates) is known as "snythesizable RTL". A logic synthesis tool with a library of components can convert a RTL description into an interconnection of primitive components that implements the circuit, subject to any specified constraints, such as timing, speed, power consumption and area constraints. Typically these constraints are specified by the designer of the circuit. The output of the logic synthesis tool, after an optimization process referred to as technology mapping, is a so-called netlist of interconnected storage elements, gates, and other functional blocks (note the term net is also a keyword in Verilog, and represents a data type comprising a physical connection between structural elements). The netlist output of the synthesis serves as input to physical design tools that physically place the logic elements and route the interconnections between them to produce a manufacturing circuit layout. When programmable parts are employed, such as field-programmable gate arrays, binary information is produced by design tools to program the logic within the parts.

Hierarchical design involves following an inverted tree in design, with the top-level design of the circuit at the root and more increasingly specific levels of detail at the branches and leaves below. Functional blocks (or modules, where the term module also a keyword in Verilog HDL) are employed at the upper echelons of the tree, while primitive blocks (such as NAND gates) are employed at the lower echelons. In theory the design process is "top down", where the circuit function is specified by text, with constraints on cost, performance and reliability, and then the circuit is designed by repeatedly dividing it into blocks as necessary. In practice, in order to obtain reusability and to make maximum use of predefined modules, it is often necessary to perform portions of the design bottom up. In addition, bottom up design is sometimes necessary to eliminate violations of constraints in a preliminary specification.

When a gate-level netlist is available, the netlist output serves as input to physical design tools that physically place the logic elements and route the interconnections between them to produce a manufacturing circuit layout. This step, called circuit layout, is unique to semiconductor circuits. Semiconductor components are physical entities in and on a wafer surface, and the dimensions and doping levels of the semiconductor components determine their electrical parameters. Circuit layout, a complicated process performed with the help of sophisticated computer-aided design (CAD) systems, starts with the translation of each of the circuit components of the netlist, and of the primitive components associated with the netlist, into physical dimensions. Physical dimensions can determine how a component behaves. For example, it is known that the resistance of a rectangular bar is given by the formula $$R = (\rho/t)\frac{L}{W},$$

where $\rho$=the resistivity of the material constituting the rectangular bar, t=the thickness of the bar, L=the length of the bar, and W=width of the bar.

Timing considerations are important in circuit layout as well. If a signal has to traverse too great a distance, it may be necessary to insert a repeater, since a signal is attenuated with distance. Likewise, if a signal has to traverse too short a distance, a buffer has to be inserted or the length of the signal path has to be artificially increased, or else timing with other signals may be skewed. In traditional models, much of the delay has been attributed to transistors, and software models have predicted the delay of such transistors. However, as circuit complexity increases, circuits (and circuit boards) have been formed of several layers (up to ten), with a via (or contact), forming a conducting pathway between two or more substrates (layers). Presently, there are no good software models for accurately predicting the delay caused by vias and wires in an integrated circuit, microchip or printed circuit board.

Therefore, it would be desirable to provide a system and method suitable for modeling electrical circuits in an improved manner.

SUMMARY OF THE INVENTION

Accordingly, the present invention is directed to a system and method of modeling electrical circuits. The present invention may provide improved software for predicting microchip interconnect delays, and in general for an improved semiconductor manufacturing models. Further, the invention may provide for accurate prediction of resistance, capacitance and inductance for interconnections in a semiconductor, allowing for both environmental values and process variations.

In a first aspect of the present invention, a method of predicting a time delay in a semiconductor includes collecting process factor data and environmental condition data for a semiconductor. The collected process factor data and environmental condition data are analyzed to determine a range of adjusted values of at least two of resistance (R), capacitance (C) and inductance (L) for the semiconductor. A time delay for the semiconductor is predicted based upon the determined range of adjusted values of the at least two of resistance (R), capacitance (C) and inductance (L) for an interconnect based upon the process factor data and environmental condition data.

In the second aspect of the present invention, a method of predicting delay in a circuit, includes collecting process factor data and environmental condition data for interconnections. The collected process factor data and environmental condition data is analyzed to determine a range of adjusted values of resistance (R), capacitance (C) and inductance (L) for the interconnections including vias. A time delay for the interconnections including vias is predicted based upon the determined range of adjusted values of the resistance (R), capacitance (C) and inductance (L) for the interconnections based upon the process factor data and environmental condition data.

In a third aspect of the present invention a system suitable for predicting a circuit delay includes an environmental condition determiner suitable for determining environmental condition data that affects calculation of at least one of the resistance (R), capacitance (C) and inductance (L) of an interconnection of a semiconductor. A process value obtainer is included, the process value obtainer suitable for collecting process values that affect calculation of at least one of the resistance (R), capacitance (C) and inductance (L) of an interconnection of a semiconductor. A processor suitable for performing a program of instructions is also included, the program of instructions configuring the processor to analyze the collected process factor data and environmental condition data to determine a range of adjusted values of the at least one of resistance (R), capacitance (C) and inductance (L) and predict a time delay for the interconnections including vias based upon the determined range of adjusted values of the resistance (R), capacitance (C) and inductance (L) for the interconnections based upon the process factor data and environmental condition data.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Figure 1:
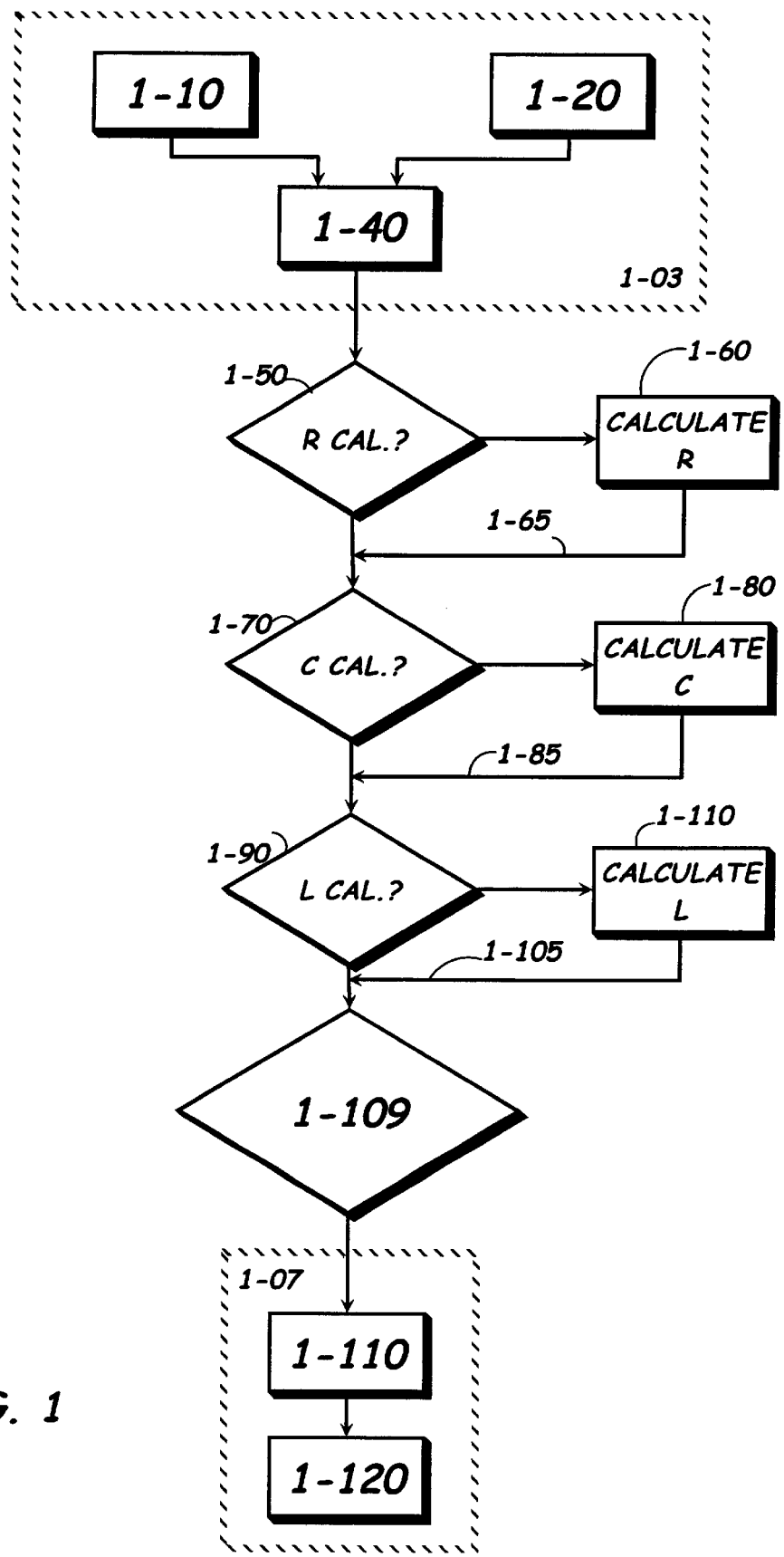
FIG. 1 is a top-level flow chart depicting an exemplary embodiment of the present invention.

Referring now to FIG. 1, an exemplary embodiment of the present invention is shown wherein a top level flowchart for carrying out a generalized software driven tool employing the principles of the present invention. The tool may be written in any computer language and run by any general-purpose computer system, preferably a computer with ample primary and secondary memory storage, or any specialized hardware or firmware. Depending on the language used to construct and implement the annotation tool software, the software may have any number of classes, functions, subroutines, objects, variables, templates, module(s), lines of code, portions of code and constructs (collectively and generally, and as depicted by the flowcharts herein, "a process step", "step", "block", "block step" or "software module", with the understanding "module" is also a keyword in Verilog) to carry out the invention in successive stages as described and taught herein, and may be either a standalone software application, or employed inside of or called by another software application. The software process or software module may be constructed so that one portion of code in the application performs a plurality of functions, as for instance in Object Oriented programming (e.g., an overloaded process). The converse is also true in that a plurality of software modules or process steps may be constructed to perform the function of a single process step described herein, without loss of generality for the present invention. At any stage of the process step of the present invention, intermediate values, variables and data may be stored for later use by the program.

Generally, the software program of the present invention may be broadly broken into three phases. In an exemplary embodiment, the present invention may accurately predict the properties of resistance (R), capacitance (C), and inductance (L) of wires or vias in a microchip, so that the delay properties of the complete interconnection may be estimated.

The first phase of the software is the collection software module phase, indicated by reference number 1-03 in FIG. 1, which asks for input from a user, which may be read from a file from a computer system, over a network, directly from instrumentation, and the like, and/or input by the user in real-time. Two sets of data may be collected during the collection phase: (1) the collection of process factors for the interconnections, and (2) the collection of environmental conditions data for the interconnections.

An analysis software module phase, indicated by reference number 1-05 in FIG. 1, may analyze data, collected during the collection software module phase, according to a variety of equations to determine a range of adjusted values for R, C and L that incorporate the environmental condition data and process condition data.

A delay prediction software module phase, indicated by reference number 1-07, where the values derived in the second phase, such as R, C and L, may be used to predict a time delay for each interconnect. The final output from the program is also output at this stage.

Turning attention now to FIG. 1, there is shown a software module block step 1-40 receiving input from box 1-10. Block 1-10 represents input of process values that affect the values of resistance (R), capacitance (C) and inductance (L) for one or more interconnects under consideration. These process values may include, but are not limited to such factors as:

metal condition, such as resistivity per square metal thickness ($\mu$m)

dielectric/isolation condition (i.e., the dielectric constant) ($\mu$m)

dielectric/isolation thickness ($\mu$m)

dielectric/isolation width ($\mu$m)

via/contact condition (such as resistivity) ($\mu$m)

via/contact thickness ($\mu$m)

interconnect layer to via/contact resistance (ohm)

The software program may store these process values, which can be input by a user in real-time or input from a text or binary file either from a system attached locally, over a network, and the like as contemplated by a person of ordinary skill in the art.

Additionally, there may be input in the program module block step 1-40 any environmental conditions data that would affect the calculation of R, C and L for the interconnect. This is shown by block step 1-30, which can be input by a user or from reading a text or binary file. Environmental conditions data may include temperature of the ambient surroundings of the microchip, temperature of the ambient surroundings of the microchip, physical dimensions of the interconnects (area A, length l), humidity, pressure and the like without departing from the spirit and scope of the present invention.

The program of the instant invention may derive a list of interconnects for analyzing, such as obtaining a list from a HDL netlist. Next, the program begins to quantify each interconnect in terms of estimated resistance (R), capacitance (C) and inductance (L). In decision module step 1-50, there is shown a first decision block for determining whether the estimated resistance (R) for a particular interconnect of the microchip under consideration has been calculated. If it has not been calculated, the "Yes" branch is selected and control of the program is passed to procedure module step 1-60, where the resistance is calculated according to the following formulas.

First resistance is calculated according to the resistance formula (R1):

$$R_{(nom)} = \rho \frac{L}{A}, \tag{R1}$$

where $R_{(nom)}$=nominal resistance, $\rho$=the resistivity of the material constituting the interconnect, L=the length of the interconnect, and A=cross-sectional area of the interconnect, assumed to be a rectangle (e.g., if a rectangle, width * depth).

Next, the worse case scenario for resistance is calculated, which is useful for computing time delay, according to the worse case resistance formula (R2):

$$R_{(wc)} = R_{(nom)} * K_{rp} * K_{rt}, \tag{R2}$$

where $R_{(wc)}$=worse case scenario resistance, which may greater or smaller than nominal resistance depending on conditioning, $R_{(nom)}$=nominal resistance, $K_{rp}$=correction factor for resistance representing process variations which may be obtained through measurement during fabrication, and $K_{rt}$=correction factor for resistance representing environmental temperature variations which may be obtained through measurement during fabrication, and typically is found in a range of approximately 0.5 to 2.5.

After these calculations, the results of the calculations for formulas R1 and R2 are stored by the program in a temporary storage file for later use, and control of the program is passed back to the main loop, as shown by reference number 1-65.

In decision block step 1-70, the software program of the present invention determines if the capacitance of the particular interconnect under consideration has been calculated. If it has not, control of the program is passed to procedure module block step 1-80, where capacitance is calculated according to the following formulas.

The nominal capacitance formula:

$$C_{(nom)} = e/t_{ox} * A, \tag{C1}$$

where A=the area of the interconnect, e=the dielectric constant for the material forming the interconnect, and $t_{ox}$=the distance of separation of two via forming an interconnect.

Next, the worse case scenario for capacitance is calculated, according to the worse case capacitance formula:

$$C_{(wc)} = C_{(nom)} * K_{cp} * K_{ct} \tag{C2}$$

where $C_{(wc)}$=worse case scenario capacitance, $C_{(nom)}$=nominal capacitance from equation C1, $K_{cp}$=correction factor for capacitance representing process variations, and $K_{ct}$=correction factor for capacitance representing environmental temperature variations, $K_{cp}$ and $K_{ct}$ may both be measured during fabrication and the like as contemplated by a person of ordinary skill in the art.

After these calculations, the results of the calculations for formulas C1 and C2 are stored by the program in a temporary storage file for later use, and control of the program is passed back to the main loop, as shown by reference number 1-85.

In decision block step 1-90, the software program of the present invention determines if the inductance of the particular interconnect under consideration has been calculated. If it has not, control of the program is passed to procedure module block step 1-100, where inductance is calculated according to the following formulas.

The nominal inductance formula:

$$L = (u/2\pi)\ln(8h/w) + w/4h) \tag{L1}$$

where $L_{(nom)}$=nominal inductance, u=magnetic permeability of the interconnect (typically $1.257 \times 10^{-8}$ H/cm), h=height above the substrate (distance to backplane); w=width of the interconnect.

Next, the worse case scenario for inductance is calculated, according to the worse case inductance formula:

$$L_{(wc)} = L_{(nom)} * K_{lp} K_{lt} \tag{L2}$$

where $L_{(wc)}$=worse case scenario for inductance, $L_{(nom)}$=nominal inductance according to formula L1; $K_{lp}$=correction factor for inductance representing process variations, and $K_{lt}$=correction factor for inductance representing environmental temperature variations based on measurements during fabrication.

After these calculations, the results of the calculations for formulas L1 and L2 are stored by the program in a temporary storage file for later use, and control of the program is passed back to the main loop, as shown by reference number 1-105.

At decision block step 1-109, the program determines whether other interconnects are present, and, if so, control is passed to the beginning of the loop comprising the analysis software module phase, otherwise, the program proceeds to the delay prediction software module phase. At this phase, as indicated by procedure block step 1-110, the delay for a semiconductor device based on the delay for the interconnects (or vias) is calculated, based on the information previous derived for the R, C, and L values for each interconnect.

The output of step 1-110 may include electronic and/or hardcopy formats, and is represented by output block step 1-120 in FIG. 1.

Figure 2:
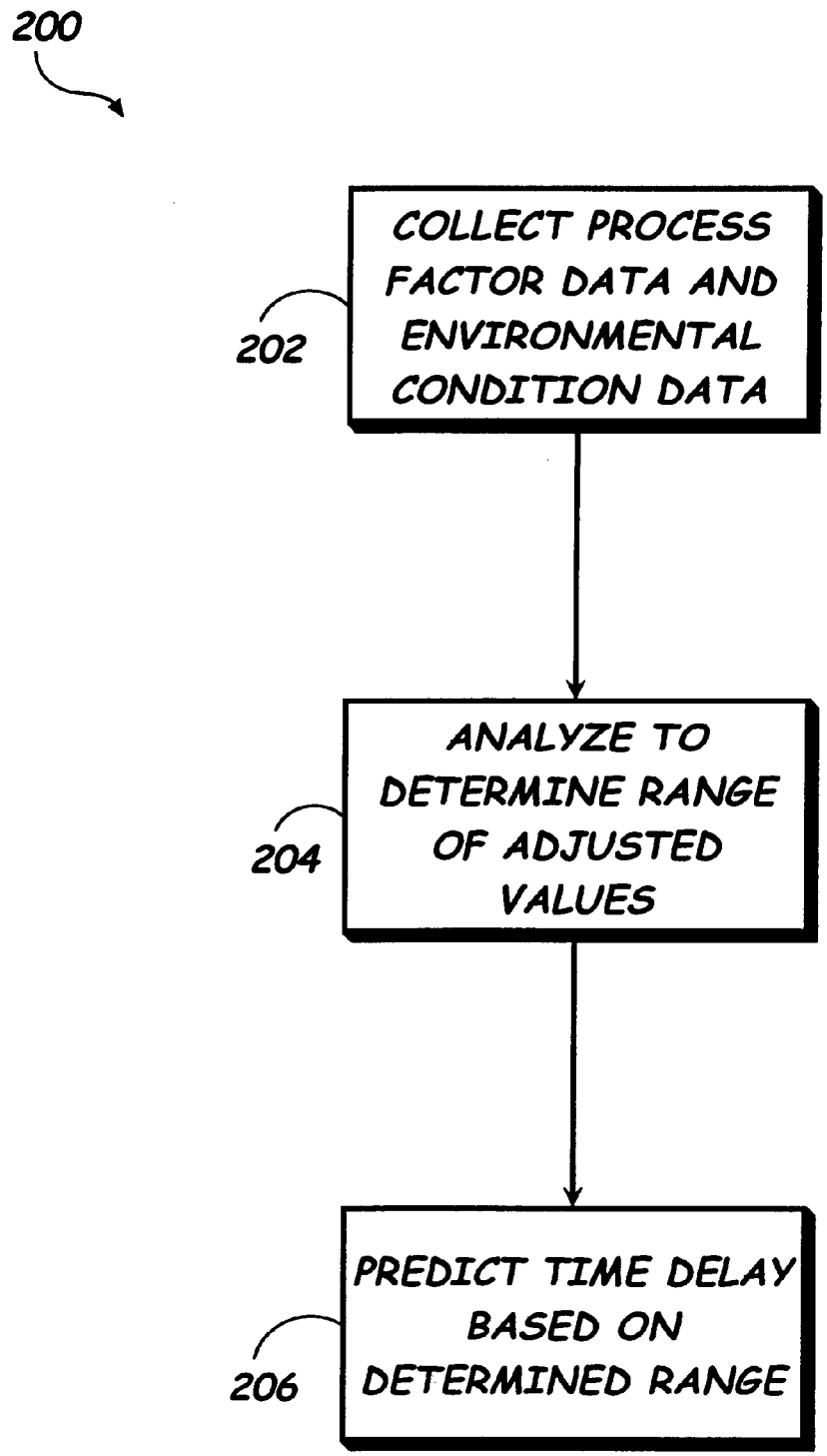
FIG. 2 is a flow diagram illustrating an exemplary method of the present invention.
Figure 3:
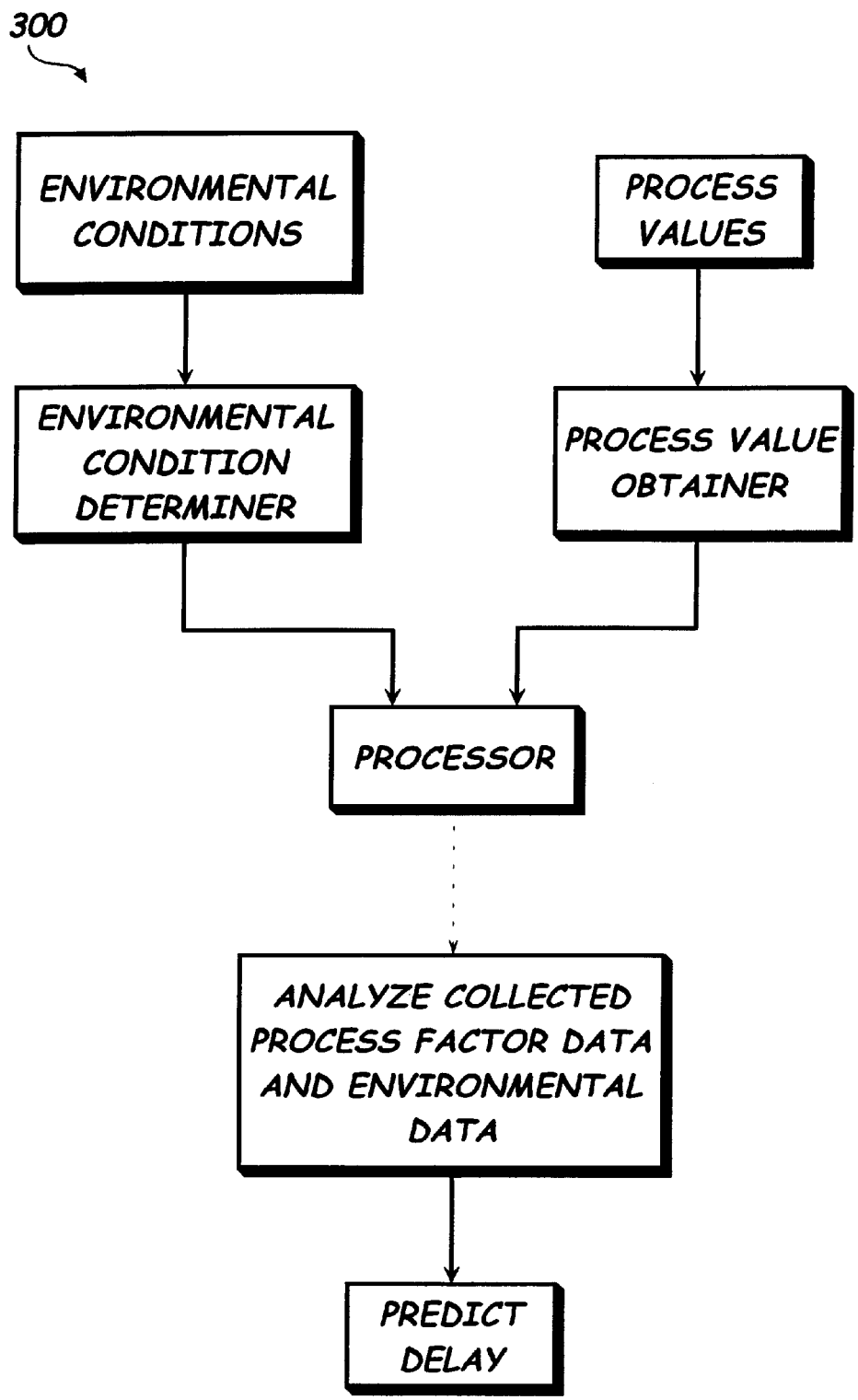
FIG. 3 is a block diagram depicting an exemplary embodiment of the present invention wherein a system suitable for predicting a circuit delay is suitable for collecting environmental condition data and process value data.

The method of practicing the present invention may include a series of steps as disclosed in the embodiments of FIG. 1 supra. For example, as shown in FIG. 2, an exemplary method 200 of the present invention is shown wherein environmental condition data and process factor data is utilized to predict a time delay. Process factor data and environmental condition data is collected 202. The data is then analyzed to determine a range of adjusted values 204, such as by utilized the exemplary equations previously discussed in regard to FIG. 1. A time delay is then predicted based on the determined range 206. In this way, a more accurate delay may be predicted, such as by including interconnects and the like of a circuit. Additionally, a system 300 may be provided to implement the present invention, an example of which is shown in FIG. 3.

Though the preferred embodiments are disclosed in the present invention, alternative mechanisms may be employed without departing from the scope of the invention. For example, the geometric shape of the interconnects can be varied, and the above referenced formulas can be accordingly modified. It is to be understood that while the invention has been described above in conjunction with preferred specific embodiments, the description and examples are intended to illustrate and not limit the scope of the invention, which is defined by the scope of the appended claims.

Although the invention has been described with a certain degree of particularity, it should be recognized that elements thereof may be altered by persons skilled in the art without departing from the spirit and scope of the invention. One of the embodiments of the invention can be implemented as sets of instructions resident in memory of one or more information handling systems. Until required by the information handling systems, the set of instructions may be stored in another readable memory device, for example in a hard disk drive or in a removable memory such as an optical disk for utilization in a CD-ROM drive, a floppy disk for utilization in a floppy disk drive, a floppy/optical disk for utilization in a floppy/optical drive, or a personal computer memory card for utilization in a personal computer card slot. Further, the set of instructions can be stored in the memory of an information handling system and transmitted over a local area network or a wide area network, such as the Internet, when desired by the user. Additionally, the instructions may be transmitted over a network in the form of an applet that is interpreted or compiled after transmission to the computer system rather than prior to transmission. One skilled in the art would appreciate that the physical storage of the sets of instructions or applets physically changes the medium upon which it is stored electrically, magnetically, chemically, physically, optically or holographically so that the medium carries computer readable information.

In exemplary embodiments, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the system and method of electrical circuit modeling of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A method for predicting a time delay in a semiconductor, comprising:

collecting process factor data and environmental condition data for a semiconductor;

analyzing the collected process factor data and environmental condition data to determine a range of adjusted values of at least two of resistance (R), capacitance (C) and inductance (L) for the semiconductor; and predicting a time delay for the semiconductor based upon the determined range of adjusted values of the at least two of resistance (R), capacitance (C) and inductance (L) for an interconnect based upon the process factor data and environmental condition data.

2. The method as described in claim 1, wherein the range of adjusted values of resistance are computed by determining nominal resistance and worse case scenario resistance.

3. The method as described in claim 2, wherein nominal resistance is computed according to the following formula:

$$R_{(nom)} = \rho \frac{L}{A}, \tag{R1}$$

where $R_{(nom)}$=nominal resistance, $\rho$=resistivity of material of the interconnect, L=length of the interconnect, and A=cross-sectional area of the interconnect.

4. The method as described in claim 2, wherein worse case scenario resistance is computed according to the following formula:

$$R_{(wc)} = R_{(nom)} * K_{rp} * K_{rt}, \tag{R2}$$

where $R_{(wc)}$=worse case scenario resistance, $R_{(nom)}$=nominal resistance, $K_{rp}$=correction factor for resistance representing process variations obtained through measurement, and $K_{rt}$=correction factor for resistance representing environmental temperature variations obtained through measurement.

5. The method as described in claim 1, wherein the range of adjusted values of capacitance are computed by determining nominal capacitance and worse case scenario capacitance.

6. The method as described in claim 5, wherein nominal capacitance is computed according to the following formula:

$$C_{(nom)} = e/t_{ox} * A, \tag{C1}$$

where A=area of the interconnect, e=dielectric constant for material forming the interconnect, and $t_{ox}$=distance of separation of two via forming an interconnect.

7. The method as described in claim 5, wherein worse case scenario capacitance is computed according to the following formula:

$$C_{(wc)} = C_{(nom)} * K_{cp} * K_{ct} \tag{C2}$$

where $C_{(wc)}$=worse case scenario capacitance, $C_{(nom)}$=nominal capacitance, $K_{cp}$=correction factor for capacitance representing process variations, and $K_{ct}$=correction factor for capacitance representing environmental temperature variations.

8. The method as described in claim 1, wherein the range of adjusted values of inductance are computed by determining nominal resistance and worse case scenario resistance.

9. The method as described in claim 8, wherein nominal inductance is computed according to the following formula:

$$L = (u/2\pi)ln(8h/w) + w/4h) \tag{L1}$$

where $L_{(nom)}$=nominal inductance, u=magnetic permeability of the interconnect, h=height above a substrate, and w=width of the interconnect.

10. The method as described in claim 2, wherein worse case scenario inductance is computed according to the following formula:

$$L_{(wc)} = L_{(nom)} * K_{lp} * K_{lt} \tag{L2}$$

where $L_{(wc)}$=worse case scenario for inductance, $L_{(nom)}$=nominal inductance; $K_{lp}$=correction factor for inductance representing process variations, and $K_{lt}$=correction factor for inductance representing environmental temperature variations based on measurement.

11. The method as described in claim 1, wherein the semiconductor includes interconnections having vias.

12. A method of predicting a delay in a circuit, comprising:

collecting process factor data and environmental condition data for interconnections;

analyzing the collected process factor data and environmental condition data to determine a range of adjusted values of resistance (R), capacitance (C) and inductance (L) for the interconnections including vias; and predicting a time delay for the interconnections including vias based upon the determined range of adjusted values of the resistance (R), capacitance (C) and inductance (L) for the interconnections based upon the process factor data and environmental condition data.

13. The method as described in claim 12, wherein the range of adjusted values of resistance are computed by determining nominal resistance and worse case scenario resistance.

14. The method as described in claim 13, wherein nominal resistance is computed according to the following formula:

$$R_{(nom)} = \rho \frac{L}{A}, \tag{R1}$$

where $R_{(nom)}$=nominal resistance, $\rho$=resistivity of material constituting the interconnect, L=length of the interconnect, and A=cross-sectional area of the interconnect.

15. The method as described in claim 13, wherein worse case scenario resistance is computed according to the following formula:

$$R_{(wc)} = R_{(nom)} * K_{rp} * K_{rt}, \tag{R2}$$

where $R_{(wc)}$=worse case scenario resistance, $R_{(nom)}$=nominal resistance, $K_{rp}$=correction factor for resistance representing process variations obtained through measurement, and $K_{rt}$=correction factor for resistance representing environmental temperature variations obtained through measurement.

16. The method as described in claim 12, wherein the range of adjusted values of capacitance are computed by determining nominal capacitance and worse case scenario capacitance.

17. The method as described in claim 16, wherein nominal capacitance is computed according to the following formula:

$$C_{(nom)} = e/t_{ox} * A, \tag{C1}$$

where A=area of the interconnect, e=dielectric constant for material forming the interconnect, and $t_{ox}$=distance of separation of two via forming an interconnect.

18. The method as described in claim 16, wherein worse case scenario capacitance is computed according to the following formula:

$$C_{(wc)} = C_{(nom)} * K_{cp} * K_{ct} \tag{C2}$$

where $C_{(wc)}$=worse case scenario capacitance, $C_{(nom)}$=nominal capacitance, $K_{cp}$=correction factor for capacitance representing process variations, and $K_{ct}$=correction factor for capacitance representing environmental temperature variations.

19. The method as described in claim 12, wherein the range of adjusted values of inductance are computed by determining nominal resistance and worse case scenario resistance.

20. The method as described in claim 19, wherein nominal inductance is computed according to the following formula:

$$L = (u/2\pi) ln(8h/w) + w/4h) \tag{L1}$$

where $L_{(nom)}$=nominal inductance, u=magnetic permeability of the interconnect, h=height above a substrate, and w=width of the interconnect.

21. The method as described in claim 19, wherein worse case scenario inductance is computed according to the following formula:

$$L_{(wc)} = L_{(nom)} * K_{lp} * K_{lt} \tag{L2}$$

where $L_{(wc)}$=worse case scenario for inductance, $L_{(nom)}$=nominal inductance; $K_{lp}$=correction factor for inductance representing process variations, and $K_{lt}$=correction factor for inductance representing environmental temperature variations based on measurements during fabrication.

22. A system suitable for predicting a circuit delay, comprising:

an environmental condition determiner suitable for determining environmental condition data that affect calculation of at least one of the resistance (R), capacitance (C) and inductance (L) of an interconnection of a semiconductor;

a process value obtainer suitable for collecting process values that affect calculation of at least one of the resistance (R), capacitance (C) and inductance (L) of an interconnection of a semiconductor; and a processor suitable for performing a program of instructions, the program of instructions configuring the processor to analyze the collected process factor data and environmental condition data to determine a range of adjusted values of the at least one of resistance (R), capacitance (C) and inductance (L) and predict a time delay for the interconnections including vias based upon the determined range of adjusted values of the resistance (R), capacitance (C) and inductance (L) for the interconnections based upon the process factor data and environmental condition data.

23. The system as described in claim 22, wherein the range of adjusted values of resistance are computed by determining nominal resistance and worse case scenario resistance, wherein nominal resistance is computed according to the following formula:

$$R_{(nom)} = \rho \frac{L}{A}, \tag{R1}$$

where $R_{(nom)}$=nominal resistance, $\rho$=resistivity of material constituting the interconnect, L=length of the interconnect, and A=cross-sectional area of the interconnect; and wherein worse case scenario resistance is computed according to the following formula:

$$R_{(wc)} = R_{(nom)} * K_{rp} * K_{rt}, \tag{R2}$$

where $R_{(wc)}$=worse case scenario resistance, $R_{(nom)}$=nominal resistance, $K_{rp}$=correction factor for resistance representing process variations obtained through measurement, and $K_{rt}$=correction factor for resistance representing environmental temperature variations obtained through measurement.

24. The system as described in claim 22, wherein the range of adjusted values of capacitance are computed by determining nominal resistance and worse case scenario resistance, wherein nominal capacitance is computed according to the following formula:

$$C_{(nom)} = e/t_{ox} * A, \tag{C1}$$

where A=area of the interconnect, e=dielectric constant for the material forming the interconnect, and $t_{ox}$=distance of separation of two via forming an interconnect; and wherein worse case scenario capacitance is computed according to the following formula:

$$C_{(wc)} = C_{(nom)} * K_{cp} * K_{ct} \tag{C2}$$

where $C_{(wc)}$=worse case scenario capacitance, $C_{(nom)}$=nominal capacitance from equation C1, $K_{cp}$=correction factor for capacitance representing process variations, and $K_{ct}$=correction factor for capacitance representing environmental temperature variations.

25. The system as described in claim 22, wherein the range of adjusted values of resistance are computed by determining nominal resistance and worse case scenario inductance, wherein nominal inductance is computed according to the following formula:

$$L = (u/2\pi) ln(8h/w + w/4h) \tag{L1}$$

where $L_{(nom)}$=nominal inductance, u=magnetic permeability of the interconnect, h=height above a substrate, and w=width of the interconnect; and wherein worse case scenario inductance is computed according to the following formula:

$$L_{(wc)} = L_{(nom)} K_{lp} * K_{lt} \tag{L2}$$

where $L_{(wc)}$=worse case scenario for inductance, $L_{(nom)}$=nominal inductance according to formula L1; $K_{lp}$=correction factor for inductance representing process variations, and $K_{lt}$=correction factor for inductance representing environmental temperature variations based on measurements during fabrication.

* * * * *